(12) United States Patent
Imai et al.

(10) Patent No.: US 7,105,400 B2
(45) Date of Patent: Sep. 12, 2006

(54) MANUFACTURING METHOD OF SEMICONDUCTOR DEVICE

(75) Inventors: Keitaro Imai, Yokohama (JP); Koji Yamakawa, Tokyo (JP); Hiroshi Itokawa, Yokohama (JP); Katsuaki Natori, Yokohama (JP); Osamu Arisumi, Yokohama (JP); Keisuke Nakazawa, Tokyo (JP); Bum-ki Moon, Hopewell Junction, NY (US)

(73) Assignees: Kabushiki Kaisha Toshiba, Tokyo (JP); Infineon Technologies, AG, Munich (DE)

( * ) Notice: Subject to any disclaimer, the term of this patent is extended or adjusted under 35 U.S.C. 154(b) by 0 days.

(21) Appl. No.: 10/673,262

(22) Filed: Sep. 30, 2003

(65) Prior Publication Data

US 2005/0070031 A1     Mar. 31, 2005

(51) Int. Cl.
H01L 21/8234 (2006.01)
H01L 21/8244 (2006.01)
H01L 21/336 (2006.01)

(52) U.S. Cl. ............... 438/238; 438/239; 438/259

(58) Field of Classification Search ............ 438/238, 438/239, 240, 259, 260, 585, 622, 691
See application file for complete search history.

(56) References Cited

U.S. PATENT DOCUMENTS

| | | | |
|---|---|---|---|
| 5,416,042 A * | 5/1995 | Beach et al. | ............ 438/240 |
| 5,452,178 A | 9/1995 | Emesh et al. | |
| 5,739,563 A | 4/1998 | Kawakubo et al. | |
| 6,153,460 A * | 11/2000 | Ohnishi et al. | ............ 438/238 |
| 6,184,927 B1 | 2/2001 | Kang | |
| 6,346,741 B1 | 2/2002 | Van Buskirk et al. | |
| 6,459,111 B1 | 10/2002 | Natori et al. | |
| 6,838,369 B1 * | 1/2005 | Lee et al. | ............ 438/622 |
| 2001/0044179 A1 | 11/2001 | Kim | |
| 2001/0053058 A1 | 12/2001 | Kim et al. | |
| 2002/0055191 A1 | 5/2002 | Matsushita et al. | |
| 2002/0197744 A1 | 12/2002 | Lee | |

FOREIGN PATENT DOCUMENTS

EP     1 289 017 A2     3/2003

OTHER PUBLICATIONS

Kinam Kim, "High density stand alone-FRAM: Present and Future", Integrated Ferroelectrics, vol. 36, 2001, pp. 21-39.

* cited by examiner

*Primary Examiner*—Walter L. Lindsay, Jr.
(74) *Attorney, Agent, or Firm*—Oblon, Spivak, McClelland, Maier & Neustadt, P.C.

(57) ABSTRACT

There is disclosed a method of manufacturing a semiconductor device, comprising forming an underlying region including an interlevel insulating film on a semiconductor substrate, forming an alumina film on the underlying region, forming a hole in the alumina film, filling the hole with a bottom electrode film, forming a dielectric film on the bottom electrode film, and forming a top electrode film on the dielectric film.

7 Claims, 7 Drawing Sheets

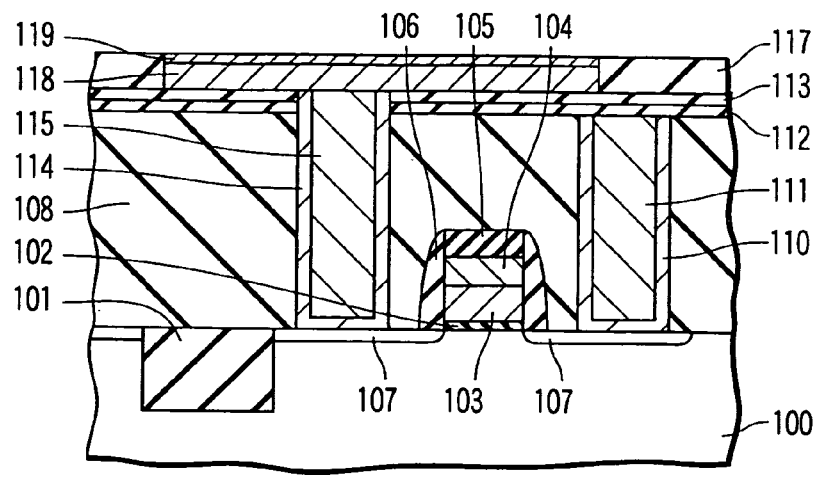
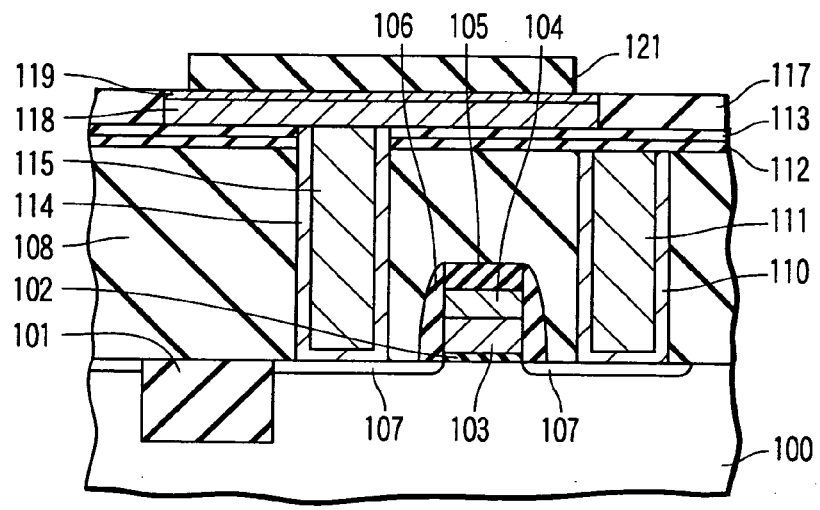
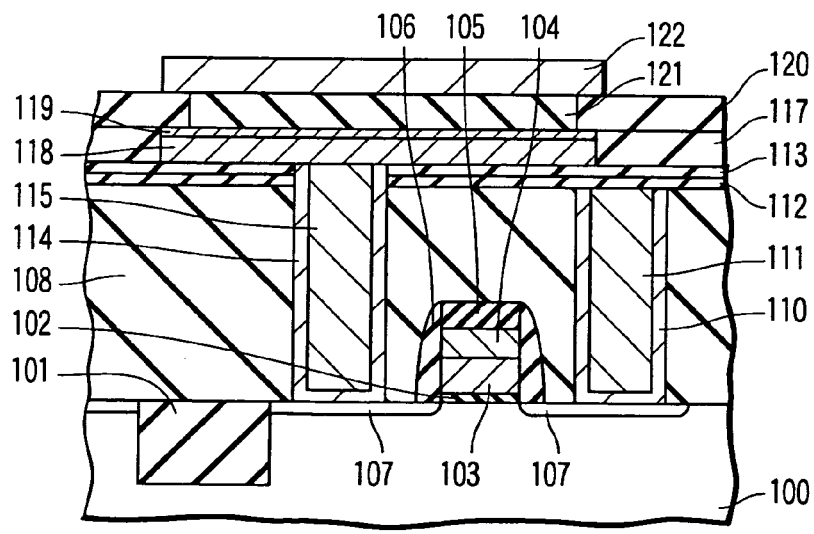

MANUFACTURING METHOD OF SEMICONDUCTOR DEVICE

BACKGROUND OF THE INVENTION

1. Field of the Invention

The present invention relates to a semiconductor device, particularly to a semiconductor device having a capacitor.

2. Description of the Related Art

In recent years, development of a ferroelectric memory (FeRAM: Ferroelectric Random Access Memory) in which a ferroelectric film is used as a dielectric film of a capacitor has been advanced. Examples of a typical ferroelectric film for use in the ferroelectric memory include a $Pb(Zr_xTi_{1-x})O_3$ film (PZT film) and $SrBi_2Ta_2O_9$ film (SBT film).

With the use of metal oxide films such as the PZT film and SBT film in the dielectric film, there is a problem that the metal oxide film is reduced by hydrogen in plasma process such as a CVD process and RIE process performed after forming the capacitor. As a result, spontaneous polarization of a ferroelectric material deteriorates. In this manner, characteristics and reliability of the capacitor deteriorate.

Moreover, in a ferroelectric memory, heat treatment at a high temperature in an oxygen atmosphere is required in order to recover the damage generated in the capacitor in the plasma process. However, there is a problem that a plug is oxidized by such heat treatment in the ferroelectric memory having a capacitor-on-plug structure (COP) in which the plug is disposed right under the capacitor. As a result, electric connection of the capacitor to the plug becomes insufficient, and the characteristics and reliability of the ferroelectric memory deteriorate.

To solve the above-described problem, it is necessary to cover the capacitor with a protective insulating film which has hydrogen and oxygen barrier properties. However, when the capacitor is formed and thereafter the protective insulating film is deposited, it is difficult to obtain satisfactory step coverage. Therefore, there is a problem that the barrier properties are insufficient.

In U.S. Pat. No. 6,153,460, there is proposed a method of forming a bottom electrode of the capacitor by a CMP process. For example, after forming a hole in an insulating film including a silicon oxide film and titanium oxide film, the hole is filled with a bottom electrode film by the CMP process. With the use of the CMP process in this manner, it is possible to solve the above-described step coverage problem. However, it can hardly be said that the silicon oxide film and titanium oxide film used as the insulating film have satisfactory barrier properties. Therefore, it is difficult to avoid the above-described problems of oxidation and reduction of the dielectric film.

As described above, in the prior-art manufacturing method, it is difficult to secure the hydrogen barrier property and oxygen barrier property, and therefore there is a problem that the characteristics and reliability of the semiconductor device having the capacitor deteriorate.

BRIEF SUMMARY OF THE INVENTION

According to a first aspect of the present invention, there is provided a method of manufacturing a semiconductor device, comprising: forming an underlying region including an interlevel insulating film on a semiconductor substrate; forming an alumina film on the underlying region; forming a hole in the alumina film; filling the hole with a bottom electrode film; forming a dielectric film on the bottom electrode film; and forming a top electrode film on the dielectric film.

According to a second aspect of the present invention, there is provided a method of manufacturing a semiconductor device, comprising: forming an underlying region including an interlevel insulating film on a semiconductor substrate; forming a bottom electrode film on the underlying region; forming an alumina film on the bottom electrode film; forming a hole reaching the bottom electrode film in the alumina film; filling the hole with a dielectric film; and forming a top electrode film on the dielectric film.

According to a third aspect of the present invention, there is provided a method of manufacturing a semiconductor device, comprising: forming an underlying region including an interlevel insulating film on a semiconductor substrate; forming an alumina film on the underlying region; forming a hole in the alumina film; filling the hole with a conductive film to form a plug; forming a bottom electrode film on the plug; forming a dielectric film on the bottom electrode film; and forming a top electrode film on the dielectric film.

According to a fourth aspect of the present invention, there is provided a method of manufacturing a semiconductor device, comprising: forming an underlying region including an interlevel insulating film on a semiconductor substrate; forming a bottom electrode film pattern on the underlying region; covering upper and side surfaces of the bottom electrode film pattern with an alumina film; removing a part of the alumina film to expose the upper surface of the bottom electrode film pattern and to leave a part of the alumina film, which is formed on the side surface of the bottom electrode film pattern; forming a dielectric film on the exposed upper surface of the bottom electrode film pattern; and forming a top electrode film on the dielectric film.

According to a fifth aspect of the present invention, there is provided a method of manufacturing a semiconductor device, comprising: forming an underlying region including an interlevel insulating film on a semiconductor substrate; forming a bottom electrode film on the underlying region; forming a dielectric film pattern on the bottom electrode film; covering upper and side surfaces of the dielectric film pattern with an alumina film; removing a part of the alumina film to expose the upper surface of the dielectric film pattern and to leave a part of the alumina film, which is formed on the side surface of the dielectric film pattern; and forming a top electrode film on the exposed upper surface of the dielectric film pattern.

BRIEF DESCRIPTION OF THE SEVERAL VIEWS OF THE DRAWING

FIGS. 4A to 4F are sectional views showing manufacturing steps of a semiconductor device according to a third embodiment of the present invention.

DETAILED DESCRIPTION OF THE INVENTION

Embodiments of the present invention will be described hereinafter with reference to the drawings.

First Embodiment

FIGS. 1A to 1F are sectional views of manufacturing steps of a semiconductor device according to a first embodiment of the present invention.

Figure 1A:
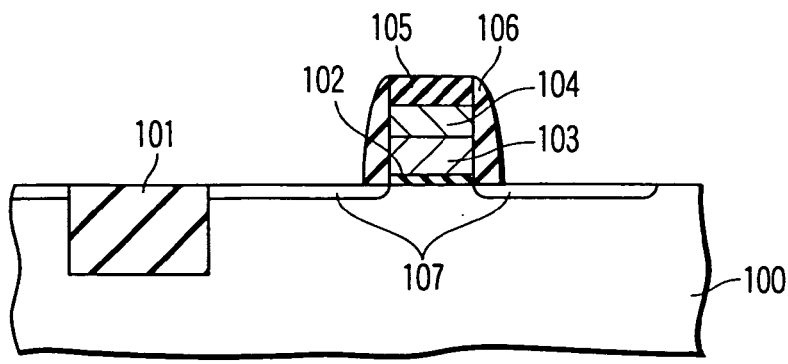
FIGS. 1A to 1F are sectional views of manufacturing steps of a semiconductor device according to a first embodiment of the present invention.

First, as shown in FIG. 1A, an isolation region 101 having a shallow trench isolation (STI) structure is formed on a p-type silicon substrate (semiconductor substrate) 100. Subsequently, an MIS transistor is formed as follows.

First, a silicon oxide film having a thickness of about 6 nm is formed as a gate insulating film 102 by thermal oxidation. Subsequently, an n$^+$-type polysilicon film 103 doped with arsenic is formed on the gate insulating film 102. Furthermore, a WSi$_x$ film 104 and silicon nitride film 105 are formed on the polysilicon film 103. Thereafter, the polysilicon film 103, WSi$_x$ film 104, and silicon nitride film 105 are processed by a usual photolithography process and RIE process to form a gate electrode. Subsequently, a silicon nitride film 106 is deposited on the whole surface. Furthermore, RIE is performed to form a side-wall spacer made of the silicon nitride film 106 on a side wall of the gate electrode. It is to be noted that detailed description is omitted, but source/drain regions 107 are formed by ion implantation and heat treatment in the present step.

Figure 1B:
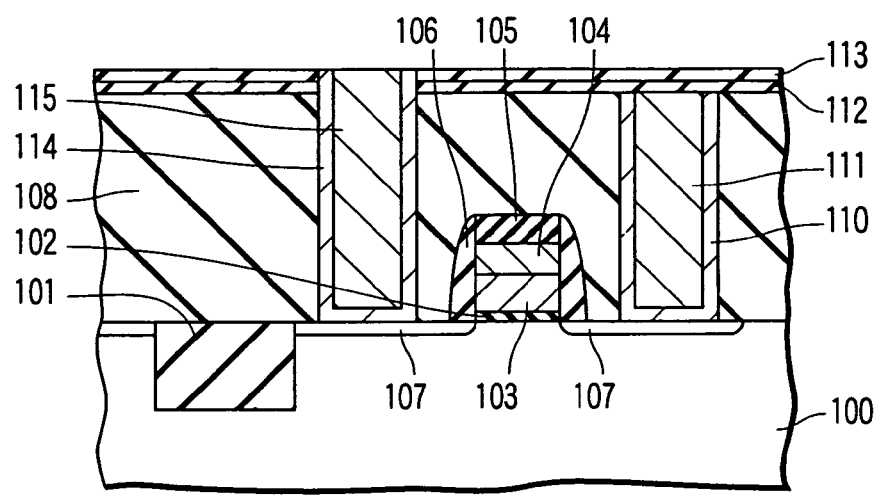

Next, as shown in FIG. 1B, a silicon oxide film 108 is deposited as an interlevel insulating film on the whole surface by a chemical vapor deposition (CVD) process, and further a flattening treatment is performed by a chemical mechanical polishing (CMP) process. Subsequently, a contact hole reaching one of the source/drain regions 107 is formed in the silicon oxide film 108. Thereafter, a titanium film is deposited by a sputtering or CVD process. Subsequently, the titanium film is nitrided by heat treatment in a forming gas to form a TiN film 110. Furthermore, a tungsten film 111 is deposited by the CVD process. Subsequently, the TiN film 110 and tungsten film 111 outside the contact hole are removed by the CMP process, and the TiN film 110 and tungsten film 111 are left in the contact hole. Thereby, a plug connected to one of the source/drain regions 107 is formed.

Thereafter, a silicon nitride film 112 and silicon oxide film 113 are deposited on the whole surface by the CVD process. Furthermore, a contact hole reaching the other source/drain region 107 is formed. Subsequently, by a method similar to the above-described method, a TiN film 114 and tungsten film 115 are formed in the contact hole. Thereby, the plug connected to the other source/drain region 107 is formed. As described above, an underlying region is formed on the silicon substrate 100.

Figure 1C:
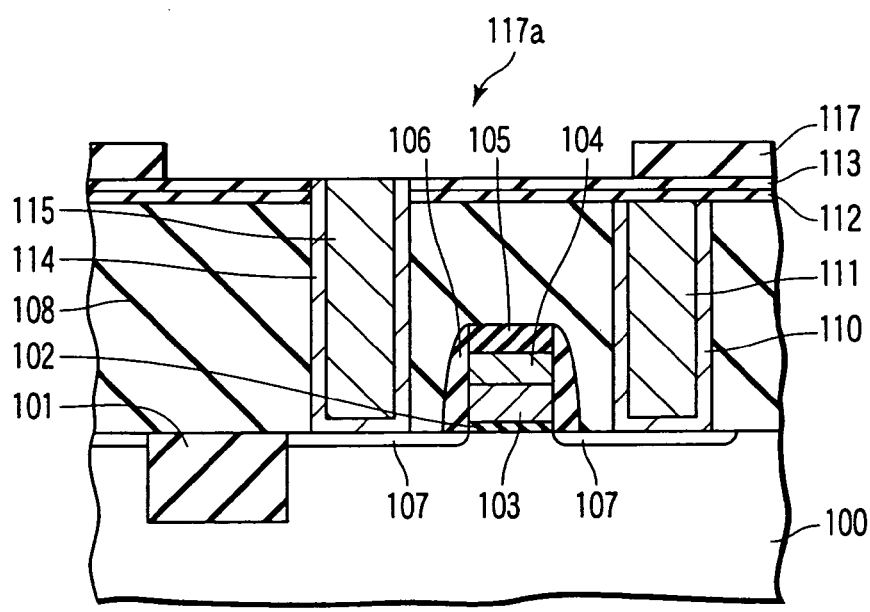

Next, as shown in FIG. 1C, an alumina film (Al$_2$O$_3$ film) 117 having a thickness of 100 nm is deposited on the whole surface by a sputtering process. Subsequently, the alumina film 117 is processed by the usual photolithography process and RIE process to form a hole 117a.

Figure 1D:
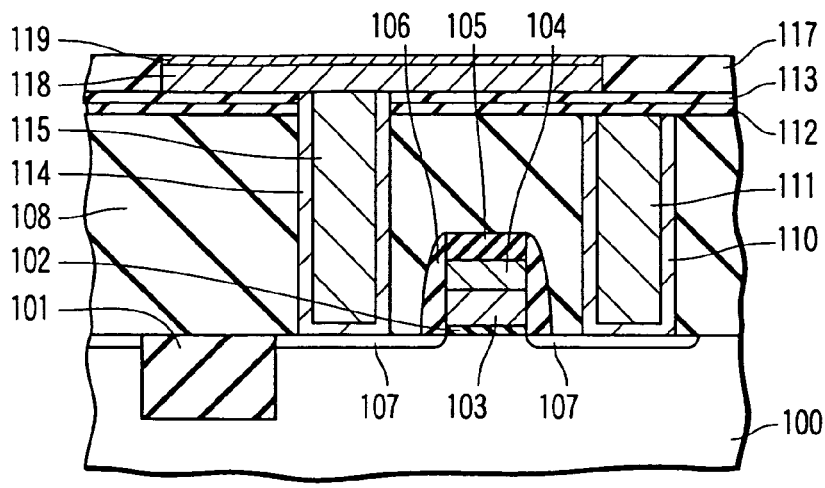

Next, as shown in FIG. 1D, the hole 117a is filled with a bottom electrode film by a damascene process. That is, an iridium film (Ir film) 118 having a thickness of 80 nm and platinum film (Pt film) 119 having a thickness of 20 nm are deposited as the bottom electrode film on the whole surface by the sputtering process. As the bottom electrode film, an iridium film having a thickness of 60 nm, iridium oxide film (IrO$_2$ film) having a thickness of 20 nm, and platinum film having a thickness of 20 nm may successively be deposited. Subsequently, the iridium film 118 and platinum film 119 outside the hole 117a are removed by the CMP process. Thereby, a bottom electrode having a damascene structure is formed.

Figure 1E:
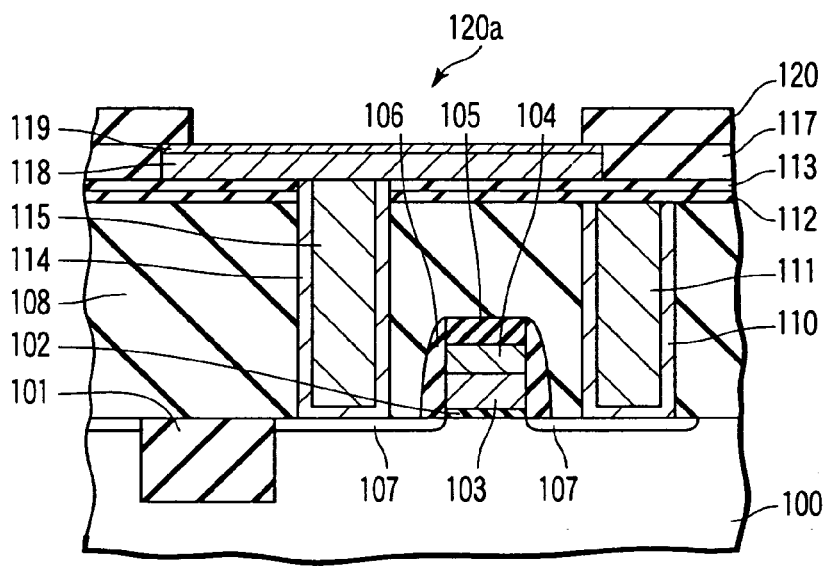

Next, as shown in FIG. 1E, an alumina film 120 having a thickness of 100 nm is deposited on the whole surface by the sputtering process. Subsequently, the alumina film 120 is processed by the usual photolithography process and RIE process to form a hole 120a.

Figure 1F:
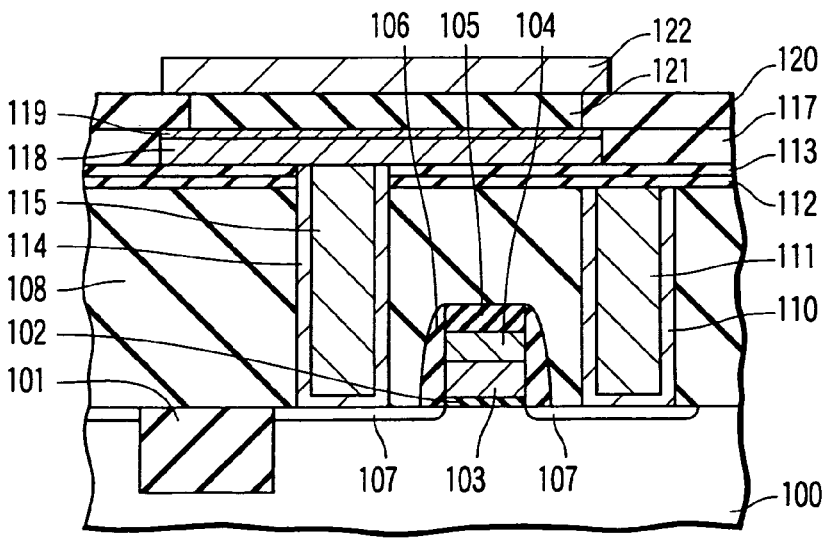

Next, as shown in FIG. 1F, the hole 120a is filled with the dielectric film by the damascene process. That is, a PZT film (Pb(Zr$_x$Ti$_{1-x}$)O$_3$ film) 121 having a thickness of 100 nm is deposited as the ferroelectric film on the whole surface by the sputtering process. Subsequently, the heat treatment is performed by rapid thermal annealing (RTA) to crystallize the PZT film 121. Furthermore, the PZT film 121 outside the hole 120a is removed by the CMP process. Thereby, a dielectric portion having a damascene structure is formed.

Next, a platinum film 122 having a thickness of 100 nm is deposited as a top electrode film by the sputtering process. Subsequently, the platinum film 122 is processed by the usual photolithography process and RIE process to form a top electrode. It is to be noted that the hole formed in the alumina film may be filled with an electrode film to form the top electrode in the same manner as in the bottom electrode and dielectric portion. Thereafter, as not shown, the silicon oxide film is deposited on the whole surface by the CVD process. Furthermore, the heat treatment is performed under the oxygen atmosphere in order to remedy a damage of the PZT film 121.

In this manner, a ferroelectric capacitor is formed comprising: the bottom electrode having a stacked structure of the iridium film 118 and platinum film 119; the ferroelectric film (PZT film 121); and the top electrode (platinum film 122).

The subsequent steps, as not shown, comprise: forming a contact portion connected to the tungsten film 111; forming a drive line and bit line; and forming metal wirings to complete a ferroelectric memory which includes a COP structure.

In this manner, in the present embodiment, the bottom electrode and dielectric portion are surrounded with the alumina film which is superior in barrier properties. Moreover, the upper surface of the dielectric portion is covered with the top electrode. Therefore, hydrogen and oxygen can be prevented from infiltrating in a treatment (treatment in the atmosphere containing hydrogen or treatment in the atmosphere containing oxygen) performed after forming the capacitor. Therefore, it is possible to prevent a problem that the PZT film (metal oxide film) is reduced by hydrogen and the characteristics and reliability of the capacitor deteriorate, and a problem that the plug right under the capacitor is oxidized and electric connection is insufficient. Therefore, it is possible to obtain the ferroelectric memory which is superior in the characteristics and reliability.

Figure 2A:
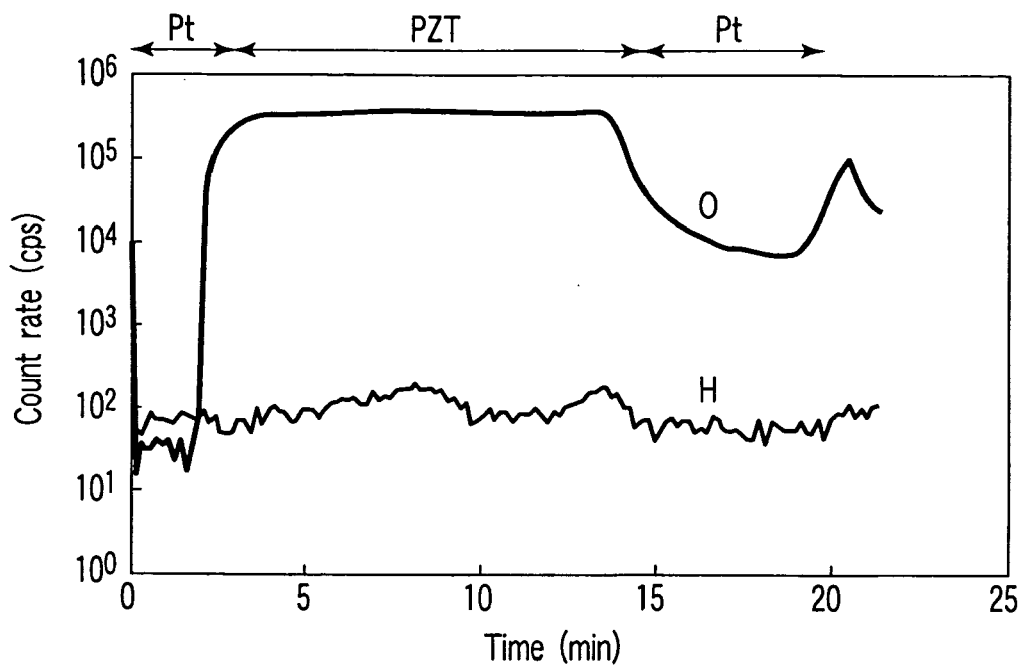
FIGS. 2A and 2B are explanatory views of a hydrogen barrier property of an alumina film.
Figure 2B:
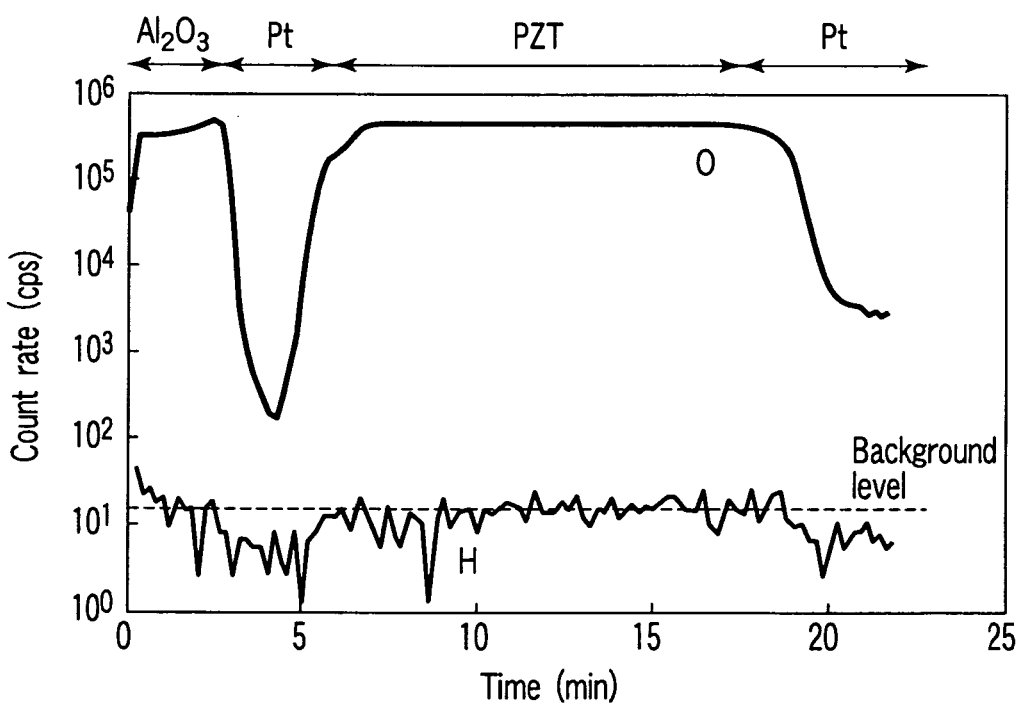

FIGS. 2A and 2B are explanatory views of the hydrogen barrier property of the alumina film. A sample of a stacked structure of a platinum film/PZT film/platinum film not covered with the alumina film, and a sample of a stacked structure of the platinum film/PZT film/platinum film covered with the alumina film having a thickness of 15 nm were prepared. Each sample was annealed in a hydrogen atmosphere at 400° C., and the annealed sample was analyzed by SIMS. It has been found that a hydrogen concentration remarkably decreases in the sample covered with the alumina film (FIG. 2B) as compared with the sample not covered with the alumina film (FIG. 2A).

Moreover, in the present embodiment, the bottom electrode and dielectric portion are formed by the damascene process. Since the alumina film is usually formed by the sputtering process, it is difficult to obtain a satisfactory step coverage. Therefore, when the alumina film is deposited after forming a capacitor structure, it is difficult to securely cover the edge of a capacitor pattern with the alumina film. In the present embodiment, by using the damascene process, the problem of the step coverage can be avoided, and therefore the barrier properties can sufficiently be secured. Therefore, a ferroelectric memory superior in characteristics and reliability can be obtained.

It is to be noted that both the bottom electrode and dielectric portion are formed by the damascene process in the above-described embodiment, but one of the bottom electrode and dielectric portion may also be formed by the damascene process.

Second Embodiment

FIGS. 3A to 3F are sectional views showing the manufacturing steps of the semiconductor device according to a second embodiment of the present invention.

Figure 3A:
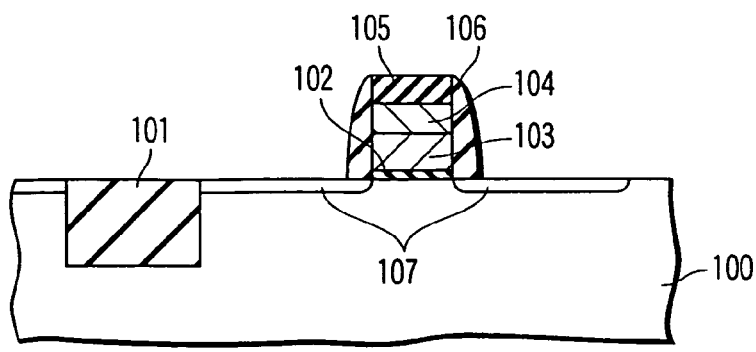
FIGS. 3A to 3F are sectional views showing manufacturing steps of a semiconductor device according to a second embodiment of the present invention.

The step of FIG. 3A is substantially similar to the step of FIG. 1A of the first embodiment, and the description thereof is omitted.

Figure 3B:
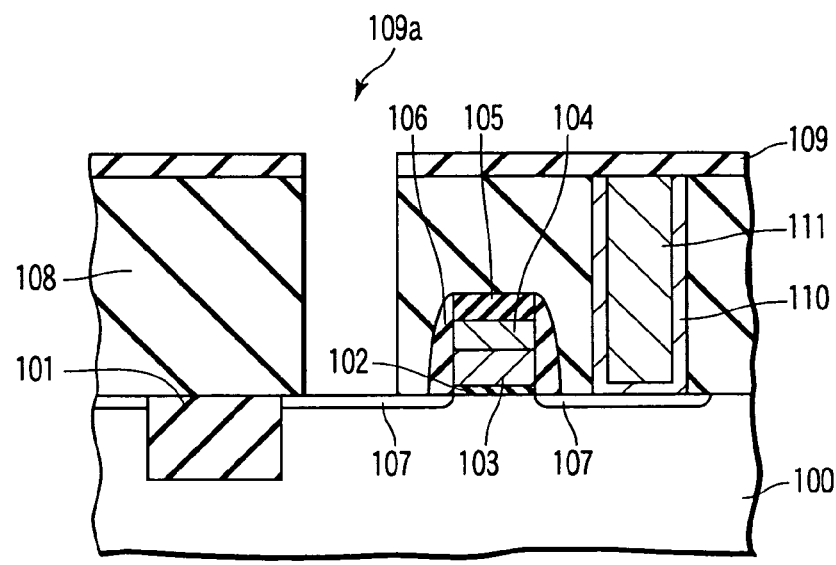

The step halfway in FIG. 3B is substantially similar to the step of FIG. 1B. That is, after depositing the silicon oxide film 108 as the interlevel insulating film, the contact hole reaching one of the source/drain regions 107 is formed in the silicon oxide film 108. Subsequently, the contact hole is filled with the TiN film 110 and tungsten film 111 to form the plug connected to one of the source/drain regions 107. As described above, the underlying region is formed on the silicon substrate 100. Thereafter, an alumina film 109 having a thickness of 100 nm is deposited on the whole surface by the sputtering process. Subsequently, a contact hole 109a reaching the other source/drain region 107 is formed in the silicon oxide film 108 and alumina film 109.

Figure 3C:
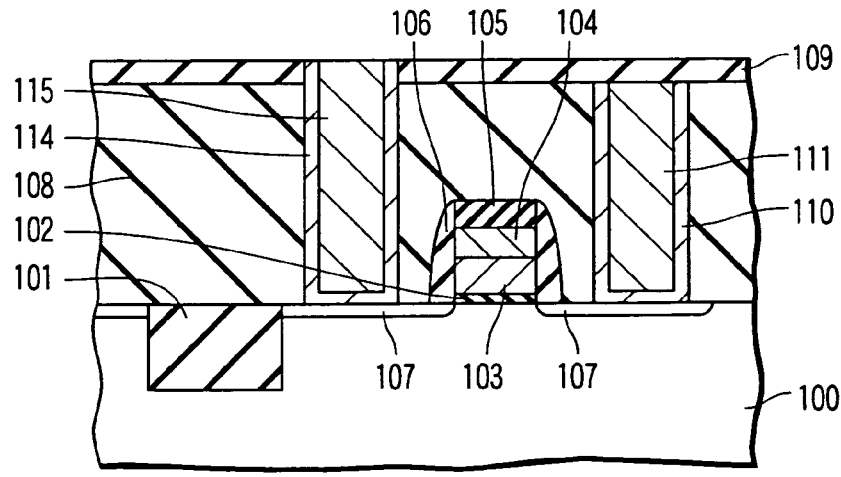

Next, as shown in FIG. 3C, the contact hole 109a is filled with a plug film. That is, the titanium film is first deposited by the sputtering process or CVD process. Subsequently, the titanium film is nitrided by heat treatment in the forming gas to form the TiN film 114. Furthermore, the tungsten film 115 is deposited by the CVD process. Subsequently, the TiN film 114 and tungsten film 115 outside the contact hole 109a are removed by the CMP process, and the TiN film 114 and tungsten film 115 are left in the contact hole. Thereby, the plug connected to the other source/drain region 107 is formed.

Figure 3D:
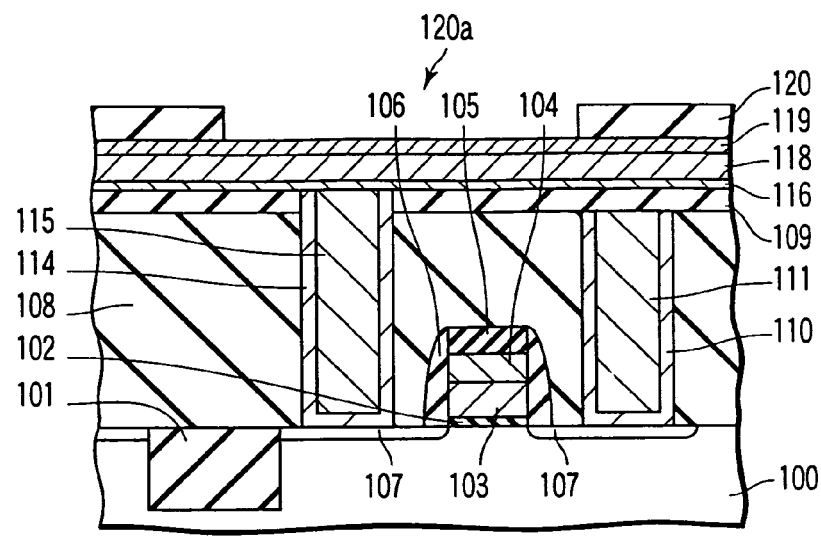

Next, as shown in FIG. 3D, a titanium film 116 having a thickness of 5 nm is deposited. Subsequently, the iridium film 118 having a thickness of 100 nm and platinum film 119 having a thickness of 20 nm are deposited as the bottom electrode film by the sputtering process. As the bottom electrode film, the iridium film having a thickness of 80 nm, iridium oxide film having a thickness of 20 nm, and platinum film having a thickness of 20 nm may successively be deposited. Furthermore, the alumina film 120 having a thickness of 100 nm is deposited on the whole surface by the sputtering process. Subsequently, the alumina film 120 is processed by the usual photolithography process and RIE process to form the hole 120a.

Figure 3E:
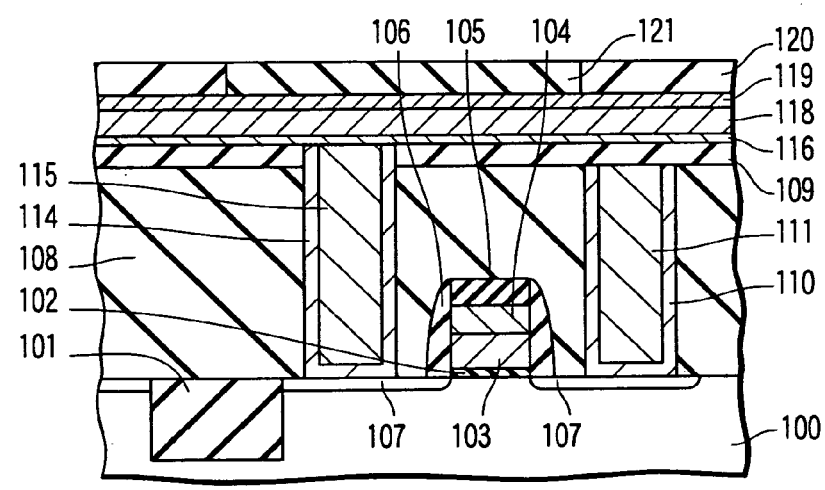

Next, as shown in FIG. 3E, the hole 120a is filled with the dielectric film by the damascene process. That is, the PZT film 121 having a thickness of 100 nm is deposited as the ferroelectric film on the whole surface by the sputtering process. Subsequently, the heat treatment is performed by RTA to crystallize the PZT film 121. Furthermore, the PZT film 121 outside the hole 120a is removed by the CMP process. Thereby, the dielectric portion having the damascene structure is formed.

Figure 3F:
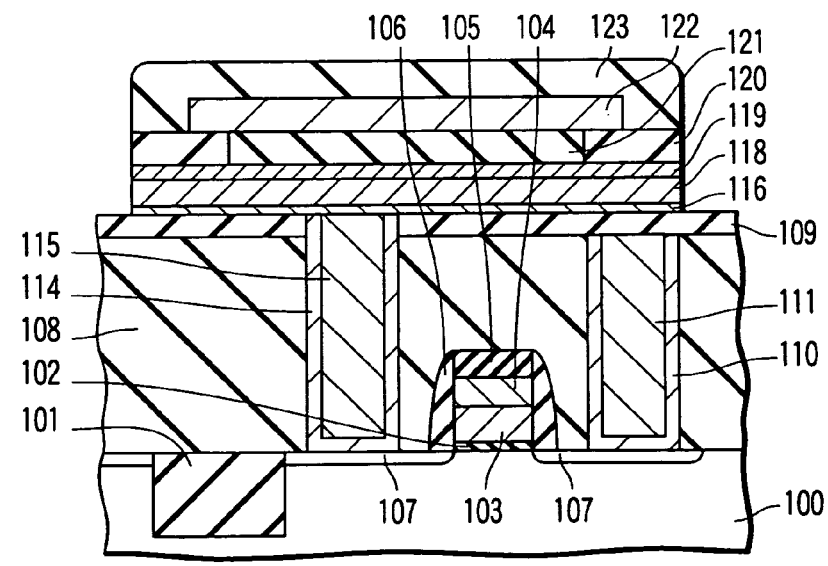

Next, as shown in FIG. 3F, the platinum film 122 having a thickness of 100 nm is deposited as the top electrode film by the sputtering process. Subsequently, the platinum film 122 is processed by the usual photolithography process and RIE process to form the top electrode. It is to be noted that the hole formed in the alumina film may be filled with the electrode film to form the top electrode in the same manner as in the dielectric portion. Thereafter, a silicon oxide film 123 is deposited on the whole surface by the CVD process, and the silicon oxide film 123 is patterned. Subsequently, the patterned silicon oxide film is used as a mask to etch the alumina film 120, platinum film 119, iridium film 118, and titanium film 116 by the RIE process. Furthermore, the heat treatment is performed under the oxygen atmosphere to remedy the damage of the PZT film 121.

In this manner, the ferroelectric capacitor is formed comprising: the bottom electrode having the stacked structure of the iridium film 118 and platinum film 119; the ferroelectric film (PZT film 121); and the top electrode (platinum film 122).

The subsequent steps, as not shown, comprise: forming the contact portion connected to the tungsten film 111; forming the drive line and bit line; and forming the metal wirings to complete the ferroelectric memory which includes the COP structure.

In this manner, in the present embodiment, the dielectric portion is surrounded with the alumina film which is superior in barrier properties, and the plug is surrounded with the alumina film. Moreover, the plug is formed by the damascene process. Therefore, it is possible to obtain the ferroelectric memory which is superior in characteristics and reliability in the same manner as in the first embodiment.

Third Embodiment

FIGS. 4A to 4F are sectional views showing the manufacturing steps of the semiconductor device according to a third embodiment of the present invention.

Figure 4A:
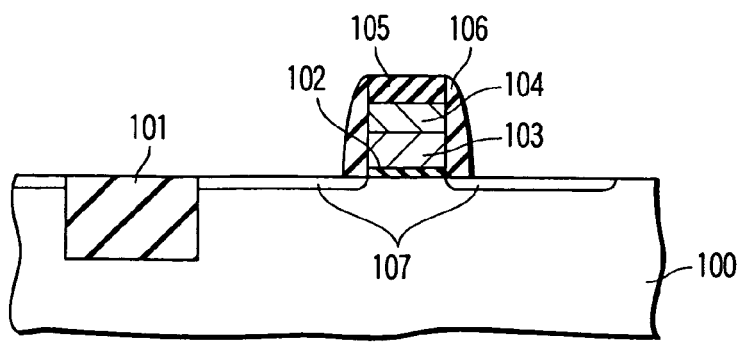
Figure 4B:
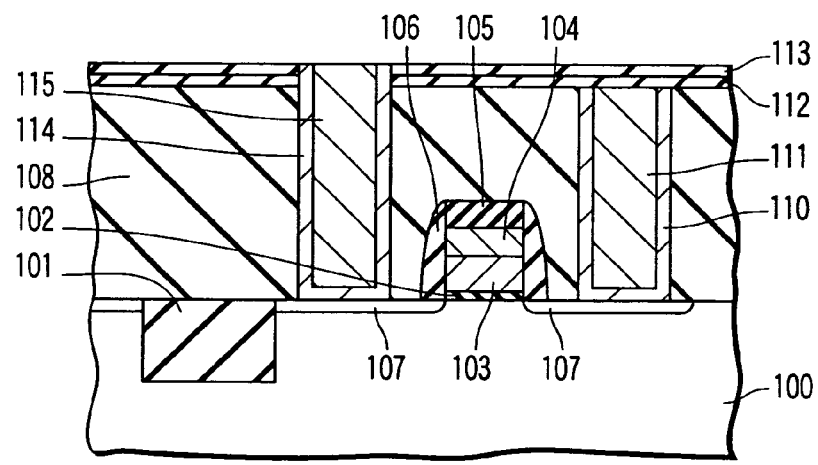
Figure 4C:
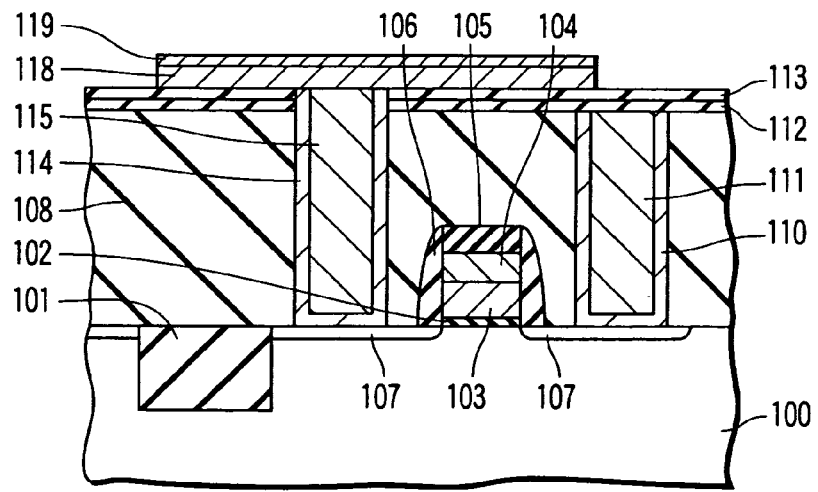

The steps of FIGS. 4A and 4B are substantially similar to the steps of FIGS. 1A and 1B of the first embodiment, and the description thereof is omitted.

After the step of FIG. 4B, as shown input 4C, the iridium film 118 having a thickness of 80 nm and platinum film 119 having a thickness of 20 nm are deposited as the bottom electrode films on the whole surface by the sputtering process. As the bottom electrode film, the iridium film having a thickness of 60 nm, iridium oxide film having a thickness of 20 nm, and platinum film having a thickness of 20 nm may successively be deposited. Subsequently, the iridium film 118 and platinum film 119 are processed by the usual photolithography process and RIE process to form the bottom electrode.

Next, as shown in FIG. 4D, the alumina film ($Al_2O_3$ film) 117 having a thickness of 100 nm is deposited on the whole surface by the sputtering process to cover the bottom electrode with the alumina film 117. Subsequently, a portion of the alumina film 117 is removed by the CMP process to expose the upper surface of the platinum film 119. By this CMP process, a structure is obtained in which the side surfaces of the iridium film 118 and platinum film 119 are surrounded with the alumina film 117.

Next, as shown in FIG. 4E, the PZT film 121 having a thickness of 100 nm is deposited as the ferroelectric film on the whole surface by the sputtering process. Subsequently, the heat treatment is performed by RTA to crystallize the PZT film 121. Subsequently, the PZT film 121 is processed by the usual photolithography process and RIE process to form the dielectric portion.

Next, as shown in FIG. 4F, the alumina film 120 having a thickness of 100 nm is deposited on the whole surface by the sputtering process to cover the PZT film 121 (dielectric portion) with the alumina film 120. Subsequently, a portion of the alumina film 120 is removed by the CMP process to expose the upper surface of the PZT film 121. By this CMP process, a structure is obtained in which the side surface of the PZT film 121 is surrounded with the alumina film 120. Thereafter, the platinum film 122 having a thickness of 100 nm is deposited as the top electrode film. Subsequently, the platinum film 122 is processed by the usual photolithography process and RIE process to form the top electrode. It is to be noted that the alumina film may be formed on the side surface of the top electrode by the CMP process in the same manner as in the bottom electrode and dielectric portion. Thereafter, as not shown, the silicon oxide film is deposited on the whole surface by the CVD process. Furthermore, the heat treatment is performed in an oxygen atmosphere in order to remedy the damage of the PZT film 121.

In this manner, the ferroelectric capacitor is formed comprising: the bottom electrode having the stacked structure of the iridium film 118 and platinum film 119; the ferroelectric film (PZT film 121); and the top electrode (platinum film 122).

The subsequent steps, as not shown, comprise: forming the contact portion connected to the tungsten film 111; forming the drive line and bit line; and forming the metal wirings to complete the ferroelectric memory which includes the COP structure.

In this manner, in the present embodiment, the bottom electrode and dielectric portion are surrounded with the alumina film which is superior in barrier properties. Therefore, it is possible to obtain the ferroelectric memory which is superior in characteristics and reliability in the same manner as in the first embodiment. Moreover, in the present embodiment, after depositing the alumina film, the alumina film on the upper surface of the bottom electrode is removed by the CMP process, and the alumina film is left only on the side surface of the bottom electrode. This also applies to the dielectric portion. As described above, since the alumina film is usually formed by the sputtering process, it is difficult to obtain the satisfactory step coverage. Therefore, when the alumina film is deposited after forming the capacitor structure, it is difficult to securely cover the edge of the capacitor pattern with the alumina film. In the present embodiment, by using the above-described method, the problem of the step coverage can be avoided, and therefore the ferroelectric memory superior in characteristic and reliability can be obtained.

It is to be noted that in the above-described embodiments, the alumina film is formed on the side surfaces of the bottom electrode and dielectric portion by the CMP process, but the alumina film may also be formed on either one of the side surfaces of the bottom electrode and dielectric portion by the CMP process.

The first to third embodiments have been described above, but these embodiments can variously be changed as follows.

In the above-described embodiments, the PZT film (Pb$(Zr_xTi_{1-x})O_3$ film) is used as the dielectric film (ferroelectric film), but the SBT film ($SrBi_2Ta_2O_9$ film) may also be used. Moreover, the method described in the above-described embodiments can also be applied to a DRAM in addition to an FeRAM. In this case, it is possible to use high dielectric constant films such as a $Ta_2O_5$ film and $(Ba,Sr)TiO_3$ film (BST film) as the dielectric film. Generally speaking, it is possible to use the metal oxide films such as the ferroelectric film and high dielectric constant film as the dielectric film.

Moreover, in the above-described embodiments, the iridium film (Ir film) and platinum film (Pt film) are used as the electrode film, but a ruthenium film (Ru film) may also be used. Furthermore, alloy films containing a noble metal (e.g., an IrTa film and IrNb film) may also be used. Additionally, the metal oxide films such as an iridium oxide film ($IrO_2$ film), ruthenium oxide film ($RuO_2$ film), and strontium/ruthenium oxide film may also be used. Generally speaking, it is possible to use a noble metal oxide film as the electrode film. Furthermore, it is also possible to use a stacked film of a noble metal film and noble metal oxide film or a stacked film of an alloy film containing a noble metal and noble metal oxide film.

Moreover, in the above-described embodiments, a tungsten plug is used as the plug, but it is also possible to use a polysilicon plug, silicide plug, or titanium oxide plug.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming an underlying region including an interlevel insulating film on a semiconductor substrate;
    forming a bottom electrode film pattern on the underlying region;
    covering upper and side surfaces of the bottom electrode film pattern with an alumina film;
    removing a part of the alumina film to expose the upper surface of the bottom electrode film pattern and to leave a part of the alumina film, which is formed on the side surface of the bottom electrode film pattern;
    forming a dielectric film on the exposed upper surface of the bottom electrode film pattern; and
    forming a top electrode film on the dielectric film.

2. The method according to claim 1, wherein forming the dielectric film comprises:
    forming a dielectric film pattern on the bottom electrode film pattern;
    covering upper and side surfaces of the dielectric film pattern with another alumina film; and
    removing a part of said another alumina film to expose the upper surface of the dielectric film pattern and to leave a part of said another alumina film, which is formed on the side surface of the dielectric film pattern.

3. The method according to claim 1, wherein removing the part of the alumina film is performed using a CMP process.

4. The method according to claim 1, wherein the dielectric film is a metal oxide film.

5. A method of manufacturing a semiconductor device, comprising:
   forming an underlying region including an interlevel insulating film on a semiconductor substrate;
   forming a bottom electrode film on the underlying region;
   forming a dielectric film pattern on the bottom electrode film;
   covering upper and side surfaces of the dielectric film pattern with an alumina film;
   removing a part of the alumina film to expose the upper surface of the dielectric film pattern and to leave a part of the alumina film, which is formed on the side surface of the dielectric film pattern; and
   forming a top electrode film on the exposed upper surface of the dielectric film pattern.

6. The method according to claim 5, wherein removing the part of the alumina film is performed using a CMP process.

7. The method according to claim 5, wherein the dielectric film is a metal oxide film.

* * * * *